United States Patent
Smal et al.

(10) Patent No.: US 9,419,358 B2
(45) Date of Patent: Aug. 16, 2016

(54) ELECTRICAL CONNECTION DEVICE, ASSEMBLY INCLUDING SUCH A DEVICE AND AN ELECTRONIC BOARD, AND METHOD FOR ELECTRICALLY CONNECTING AN ELECTRONIC BOARD

(75) Inventors: Pierre Smal, Sartrouville (FR); Guillaume Sanvito, Elancourt (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 22 days.

(21) Appl. No.: 14/236,769

(22) PCT Filed: Jul. 31, 2012

(86) PCT No.: PCT/FR2012/051804
§ 371 (c)(1),
(2), (4) Date: Sep. 23, 2014

(87) PCT Pub. No.: WO2013/021119
PCT Pub. Date: Feb. 14, 2013

(65) Prior Publication Data
US 2015/0011112 A1    Jan. 8, 2015

(30) Foreign Application Priority Data

Aug. 8, 2011   (FR) ...................................... 11 57236

(51) Int. Cl.
*H01R 12/70*       (2011.01)
*H05K 5/00*        (2006.01)
(Continued)

(52) U.S. Cl.
CPC ........ *H01R 12/7082* (2013.01); *H01R 12/7005* (2013.01); *H01R 43/02* (2013.01); *H05K 5/0069* (2013.01); *H05K 7/1432* (2013.01); *Y10T 29/49144* (2015.01)

(58) Field of Classification Search
CPC ........... H01R 23/7026; H01R 13/6658; H01R 23/7057; H01R 33/7628; H01R 2103/00; H01R 23/025
See application file for complete search history.

(56) References Cited

U.S. PATENT DOCUMENTS

| 3,315,217 A | 4/1967 | Bird |
| 5,575,663 A | 11/1996 | Broschard, III et al. |
| 5,709,556 A * | 1/1998 | Tan et al. ........................ 439/79 |

(Continued)

FOREIGN PATENT DOCUMENTS

| DE | 10 2009 043322 A1 | 3/2011 |
| EP | 0 911 949 A1 | 4/1999 |

(Continued)

OTHER PUBLICATIONS

International Search Report issued in PCT/FR2012/051804 mailed on Feb. 14, 2013 (6 pages).

*Primary Examiner* — Gary Paumen
(74) *Attorney, Agent, or Firm* — Osha Liang LLP

(57) ABSTRACT

The invention relates to a device (2) for electrically connecting an electronic board (22), including at least one electrical conductor (23) for conducting a current to and/or from said electronic board (22), a body (24) extending in at least one plane (26) and retaining said electrical conductor (23) in said plane via a portion of said conductor, and at least one outgrowth (28) extending from said body (24), said outgrowth (28) including at least one member (30) for assembling said connection device (20) to said electronic board (22), such that the body (24) is opposite the electronic board (22).

17 Claims, 4 Drawing Sheets

(51) Int. Cl.
*H05K 7/14* (2006.01)
*H01R 43/02* (2006.01)

(56) References Cited

U.S. PATENT DOCUMENTS

| | | | |
|---|---|---|---|
| 5,865,645 A * | 2/1999 | Embo et al. | 439/567 |
| 6,106,331 A * | 8/2000 | Kurotori et al. | 439/567 |
| 6,196,870 B1 * | 3/2001 | Wu | 439/567 |
| 6,386,910 B1 * | 5/2002 | Yu | 439/567 |
| 6,648,682 B1 * | 11/2003 | Wu | 439/567 |
| 6,679,727 B1 * | 1/2004 | Yu | 439/567 |
| 7,789,702 B1 * | 9/2010 | Xiang et al. | 439/567 |
| 2002/0081900 A1 * | 6/2002 | Yu et al. | 439/567 |
| 2004/0053529 A1 * | 3/2004 | Kato et al. | 439/567 |
| 2005/0106937 A1 * | 5/2005 | Lin | 439/567 |
| 2007/0173114 A1 * | 7/2007 | Takahashi et al. | 439/567 |
| 2009/0124111 A1 | 5/2009 | Rabotti | |
| 2010/0020516 A1 | 1/2010 | Kishino et al. | |

FOREIGN PATENT DOCUMENTS

| | | |
|---|---|---|
| EP | 1 117 155 A1 | 7/2001 |
| GB | 2 259 613 A | 3/1993 |

\* cited by examiner

ELECTRICAL CONNECTION DEVICE, ASSEMBLY INCLUDING SUCH A DEVICE AND AN ELECTRONIC BOARD, AND METHOD FOR ELECTRICALLY CONNECTING AN ELECTRONIC BOARD

The invention relates to a device for electrically connecting an electronic board. In particular, the invention relates to a device for electrically connecting an electronic board mounted in an electric machine housing.

Using an electrical connection device to connect an electronic board is known. FIG. 1 shows an example of such an electrical connection device 10. Typically, the connection device 10 includes tongue-shaped electrical connectors 12, which are held together by an electrically insulating material 14. Such a device 10 is known as a "busbar".

The connectors 12 electrically connect an electronic board 16. Typically, the electronic board 16 is housed in a recess 17 of a housing 18 of an electric machine (not shown) in order to provide power or control signals to the electric machine.

During the electrical connection of the electronic board 16, the electrical connection device 10 is positioned and fixed on the housing 18, for example, on a portion 19 of the housing 18. The ends of the electrical connectors 12 contact the surface of the electronic board 16 in order to bring into electrical contact the components of the board 16. Bringing the electrical connectors 12 into electrical contact with terminals of the components can be achieved, for example, by a weld or by a solder via electric reflow.

However, the quality of the electrical connection greatly depends on the mechanical stress or effort between the connectors 12 and the board 16 during the electrical connection operation. In order to provide an electrical connection lifetime, the connectors 12 must exert a mechanical stress on the board 16. An aim is, therefore, to obtain a mechanical stress between the connectors 12 of the electrical connection device 10 and the board 16.

To this end, the connection device 10 is screwed onto the housing 18 such that the connectors 12 thereof exert an effort on the electronic board 16, for example on the terminals of the components. Then, the assembly, including the housing 18, the electronic board 16 and the connection device 10, is typically placed in a welding station in order to weld the connectors 12 onto the electronic board 16. However, if the weld turns out to be faulty, it is difficult to recover the elements from the assembly such as the housing 18, in order to reuse them.

Another solution consists in firstly welding the electrical connection device 10 and the board 16 with an effort to provide a weld lifetime. Then, the assembly made up of the board 16 and of the electrical connection device 10 is mounted in the recess 17 of the housing 18. However, tearing stresses between the connectors 12 and the board 16 can occur after mounting the board 16 and the device 10, in particular when screwing the device 10 into the housing 18. These tearing stresses weaken the weld and therefore reduce the lifetime thereof. Positioning a low wall 15 under the connection device 10 as is shown in FIG. 2 is known. Therefore, when the connection device 10 is screwed onto the housing 18, the connector 12 tilts forward to bear on the electronic board 16. However, between the welding operation and mounting in the housing 18, the board 16 and the device 10 must be handled with caution in order to prevent one moving in relation to the other, which would weaken the weld.

Therefore, a simple and reliable means is sought, which provides a mechanical stress between electrical connectors and an electronic board.

To this end, a device for electrically connecting an electronic board is proposed, which includes
at least one electrical conductor for conducting a current to and/or from said electronic board,
a body holding said electrical conductor at a portion of said conductor, and
at least one protuberance extending from said body, said protuberance including at least one member for assembling the connection device with said electronic board.

The portion of the electrical conductor held by the body can be rigidly connected to the latter, for example, by heading, latching, by enclosing in the material of the body, the latter being, for example, overmolded, or by force-mounting in a housing of the body.

According to one embodiment, the assembling member includes a first substantially flat portion starting at a distal end of the protuberance and extending towards the exterior of the connection device.

According to an embodiment, said first portion includes a through-hole.

According to an embodiment, the assembling member includes a second substantially flat portion transverse to the first portion, the second portion including a hole.

According to an embodiment, the hole is a through-hole.

According to an embodiment, the body extends at least in one plane and holds the electric conductor at said plane, and said protuberance extends from said body in a direction transverse to said plane.

According to an embodiment, the body has a substantially rectangular shape in said plane.

According to an embodiment, the protuberance extends from a periphery of the body.

According to an embodiment, the body and the protuberance are in one piece.

The invention also relates to an assembly including a first electronic board and an electrical connection device according to the invention wherein the body of the connection device has a first face which is placed opposite the first electronic board, and the assembling member rigidly connects together the first electronic board and the connection device.

According to an embodiment, the assembling member rigidly connects the connection device and the first board at a periphery of the first board.

According to an embodiment, the first electronic board includes a toe engaging the hole of the assembling member, particularly the hole of the second portion of this member.

According to an embodiment, said toe is located on a peripheral edge of the first electronic board.

According to an embodiment, the assembly further includes a second electronic board mounted opposite a second face of the body, said second face being opposite the first face.

The invention also relates to a method of electrically connecting an electronic board including steps of:
assembling the device according to the invention with the electronic board by means of the assembling member,
connecting the electrical conductor of said connection device to the electronic board.

According to an embodiment, the electrical conductor is connected by soldering.

The electrical connection device according to the invention allows an electronic board to be connected. The device includes at least one electrical conductor for conducting a current to and/or from said electronic board. The device further includes a body holding the electrical conductor at a portion of the conductor. Thanks to the body, the electrical conductor can be handled to be positioned with the board in a direction such as to electrically connect the board. At least one protuberance extends from the body. This protuberance includes at least one member for assembling the connection device with the electronic board. The protuberance and the assembling member allow the electrical conductor to be held in position in relation to the electronic board. Therefore, the conductor and the electronic board do not move in relation to one another. The conductor can therefore be connected to the board in a reliable manner, and the assembly made up of the connection device and of the board can be handled without weakening the connection of the conductor and the board.

The invention further relates to a device for electrically connecting an electronic board including:
- at least one electrical conductor for conducting a current to and/or from said electronic board,
- a body extending at least in one plane and holding, in this plane, said electrical conductor at a portion of said conductor, and
- at least one protuberance extending from said body, said protuberance including at least one member for assembling the connection device with said electronic board such that the body is placed opposite the electronic board.

The device can include one or more of the features presented above.

According to an embodiment of the devices according to the invention, said protuberance extends from said body in a direction transverse to said plane.

According to an embodiment of the devices according to the invention, the body has a wall shape which extends in a plane. In particular, the body includes at least one opening configured to allow access to the end of the conductor which is in contact with the board when the device is positioned thereon.

According to an embodiment, the assembly according to the invention is further configured in order to be applied to a surface, assembly wherein the device according to the invention includes a conductor configured to allow another ground connection between the electronic board and said surface.

The invention can be better understood upon reading the following description of non-limiting examples for implementing the invention and upon examining the appended drawings, wherein.

Figure 1:
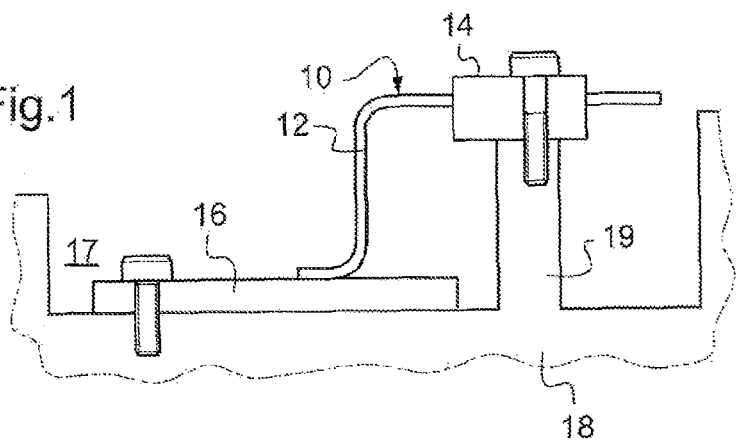
FIG. 1 shows an electrical connection device according to the prior art which is connected to an electronic board.
Figure 2:
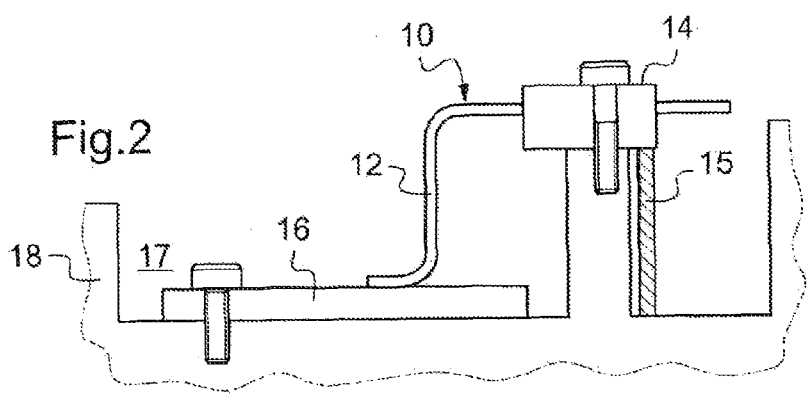
FIG. 2 shows another electrical connection device according to the prior art which is connected to an electronic board.

It should be noted that the figures disclose the invention in a detailed manner in order to implement the invention. Of course, these figures can be used to better define the invention if required.

A device 20 according to an embodiment according to the invention will be described with reference to FIG. 3, wherein the device 20 is connected to an electronic board 22.

The device 20 includes at least one electrical conductor 23 held by a body 24. The body 24 allows the electrical conductor 23 to be handled in order to bring it into contact with the electronic board 22.

For example, the body 24 extends at least in a plane 26. In particular, the body 24 has a substantially rectangular shape in this plane 26. The body 24 can then have the shape of a frame or have a solid surface. In particular, the body 24 has a shape intended to correspond with an external periphery of the electronic board 22.

The electrical conductor 23 particularly allows a component of the board 22 to be connected to an element external to the board 22 such as a high-voltage electrical source, an electrical motor or any other electronic component. For example, the conductor 23 delivers to the board 22 a current coming from an electrical source. In particular, the current is between 4 A and 400 A. In another example, the conductor 23 transmits a current coming from the board 22 to an electric motor.

The electrical conductor 23 is particularly configured in order to be deformed. For example, the electrical conductor is a spring blade 23. Therefore, the electrical conductor 23 can be deformed such as to allow the electronic board 22 to be brought and assembled with the connection device 20.

For example, the conductor 23 includes two ends 23a, 23b. A first end 23a of the conductor 23 is free of the material of the body 24 in order to be brought into contact with the element external to the board 22. A second end 23b is also free of the material of the body in order to be brought into contact with the electronic board 22.

In the example described, the conductor 23 is held by the body 24 at a portion between the first end 23a and the second end 23b by any known means. In particular, the material of the body 24 surrounds this portion of the conductor 23. In other words, the material of the body 24 engages the portion of the conductor 23. The body 24 can be over-molded about the portion. Alternatively, the conductor 23 can be inserted into a matching opening of the body 24 in order to be held at this portion. In a specific example, the conductor 23 is held by the body 24 by heading or by latching.

In an example, the conductor 23 extends at least partially in the plane 26 and is held by the body 24 at this plane 26.

In particular, between the portion in the plane 26 and the second end 23b, the conductor 23 has a deformation in a direction transverse, particularly perpendicular, to the plane 26. Therefore, the second end 23b of the conductor 23 comes into contact with the board 22 when the board 22 is brought closer to the connection device in a direction transverse, particularly perpendicular, to the plane 26.

The conductor 23 is made from a material having an electrical conductivity for operation of electronic components. For example, the conductor 23 is made from a metal such as copper or from an alloy such as an alloy of aluminum and copper.

The device 20 can include one or more conductors 23 as described above. In one embodiment, the device 20 includes several conductors 23. The body 24 then allows the conductors 23 to be handled together. Therefore, the conductors 23 can be placed at the same time on the board 22 in order to be connected thereto. Connecting the board 22 is therefore simplified.

In particular, the conductors 23 extend at least partially in the plane 26 and are held together in this plane 26. Between the portion thereof in the plane 26 and the second end 23b thereof, the conductors 23 have a deformation in a direction transverse, particularly perpendicular, to the plane 26, by extending from a same face of the plane 26. Therefore, the second ends 23b of the conductors 23 come into contact with the board 22 when the board 22 is brought closer to the connection device 20 in a direction transverse, particularly perpendicular, to the plane 26 opposite this face.

The device 20 includes at least one protuberance 28 which extends from the body 24. The protuberance 28 includes at least one member 30 for assembling with the electronic board 22.

The protuberance 28 and the assembling member 30 allow the electrical conductor 23 to be held in position in relation to the electronic board 22. In particular, the second end 23b of the conductor 23 and the electronic board 22 do not move in relation to one another. The conductor 23 can therefore be connected to the board 22 in a reliable manner, and the assembly made up of the connection device 10 and of the board 22 can be handled without weakening the connection of the conductor 23 and the board 22.

In an embodiment, the protuberance 28 extends, for example, from a periphery of the body 24. In particular, the periphery is in the portion of the body extending in the plane 26. The protuberance 28 extends, for example, in a direction transverse, particularly perpendicular, to the plane 26. The protuberance 28 extends from the same face of the plane as the electrical conductor 23. In a specific example, the protuberance 28 is a continuous wall extending from the entire periphery of the body 24, particularly on the perimeter of the latter.

The body 24 and the protuberance 28 are, for example, in one piece. In particular, the protuberance 28 is integrally formed with the body 24. The body 24 and the protuberance 28 are preferably made from an electrically insulating material such as plastic. Indeed, plastics have the necessary insulating features for electrically insulating the electrical conductor 23 while being sufficiently rigid to allow the protuberance 28 to maintain the position of the conductor 23 in relation to the electronic board 22.

The assembling member 30 rigidly connects the connection device 20 with the electronic board 22. The assembling member 30 will be better described with reference to FIGS. 4 and 5.

The assembling member 30 is, for example, positioned at a distal end of the protuberance 28. The assembling member 30 can include a first substantially flat portion 30a which starts at the distal end of the protuberance 28 in order to extend towards the exterior of the connection device 20. In particular, the first portion 30a extends in a dimension that is substantially orthogonal in relation to the distal end of the protuberance 28.

For example, the first portion 30a includes a through-hole. A rigid connection member, such as a screw, is placed into the through-hole and into a corresponding hole of the board 22 such as to rigidly connect the connection device 20 to the board 22.

Figure 4:
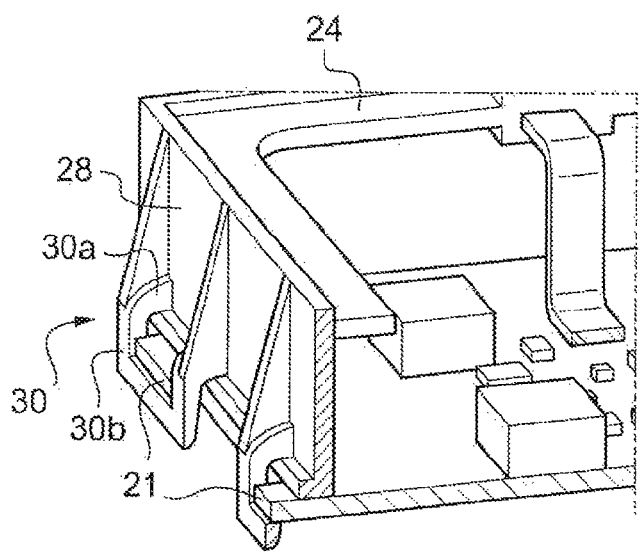
FIG. 4 shows a sectional view of the device example shown in FIG. 3.
Figure 5:
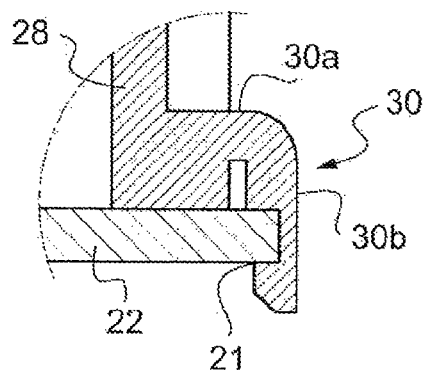
FIG. 5 shows a sectional view of a device example according to the invention.

The assembling member 30 can further include a second substantially flat portion 30b transverse to the first portion 30a. The second portion 30b includes a hole into which an element of the board 22 can be inserted by latching for example. Therefore, the assembling member 30 rigidly connects the connection device 10 to the electronic board 22. The hole can be a through-hole as illustrated in FIG. 4 or a non-through-hole as illustrated in FIG. 5.

Figure 6:
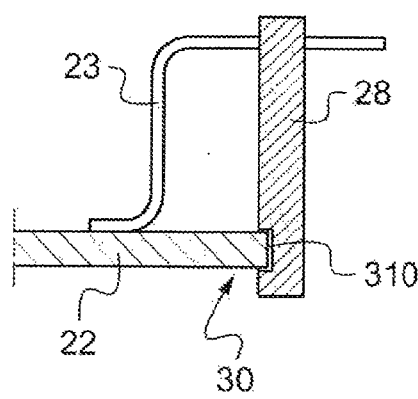
FIG. 6 shows a sectional view of another device example according to the invention.

In an embodiment illustrated in FIG. 6, the assembling member 30 consists of a groove 310 in the distal end of the protuberance 28. A peripheral edge of the electronic board 22 is intended to correspond with the groove 310.

Figure 7:
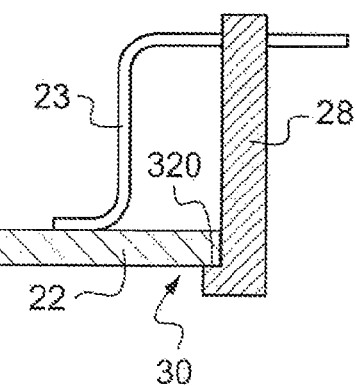
FIG. 7 shows a sectional view of yet another device example according to the invention.

In another embodiment illustrated in FIG. 7, the assembling member 30 consists of a substantially flat portion 320 which starts at the distal end of the protuberance 28 in order to extend towards the interior of the connection device 20. The electronic board 22 is intended to be placed on this portion 320. In particular, the electronic board 22 is held by the pressure exerted by the electrical conductor 23.

In the two preceding embodiments, the body 24 and/or the protuberance 28 are preferably made from a plastic which is sufficiently deformable in order to allow the board 22 to be inserted into the groove 310 or onto the portion 320 and at the same time sufficiently rigid to hold the electrical conductor 23 in position in relation to the board 22.

In an embodiment, the second end 23b of the electrical conductors 23 is located at a distance from the plane 26, which is greater than the distance from the distal end of the protuberance 28. Therefore, when the connection device 10 is placed on the electronic board 22, the connectors 23 exert a stress on the surface of the board. Therefore, the connections of the conductors on the electronic board 22 are strengthened, in particular when the connections are welds or solders.

The invention also relates to an assembly including the connection device 10 according to the invention and a first electronic board. The first electronic board corresponds, for example, to the electronic board 22 described above.

In the assembly according to the invention, a first face of the body 24 is placed opposite the first board 22.

The assembling member 30 rigidly connects together the first electronic board 22 and the connection device 20. Therefore, the electrical conductor 23 is positioned on the first board 22 in order to be connected thereto. The connector can be connected to the electronic board prior to mounting the assembly in a recess of a housing, for example. Therefore, connection difficulties linked to the recess environment, for example linked to the bulkiness of the other component(s) of the housing, are avoided. The first board 22 and the connection device 20 can be handled together without weakening the connection of the conductor 23 to the board 22. In particular, the conductor 23 exerts a stress on the first board 22. Therefore, the connection of the conductor 23 to the first board 22 has an improved lifetime. For example, the connection is a weld or a solder via electric reflow.

In one embodiment, the connection device 20 and the board 22 are rigidly connected at a periphery of the board 22. Therefore, the internal part of the board 22 is reserved for the electrical components, and the routing of the components is simplified thereby.

In another embodiment, the connection device 20 is rigidly connected on a part of the electronic board 22. The first face of the connection device 20 is placed opposite a first portion of the electronic board 22 so as to connect the first portion with the electrical conductor(s) 23. A second portion of the board 22 remains free of the electrical conductor(s) 23.

In yet another embodiment, the first face of the connection device 20 includes a first portion which is placed opposite the whole of the board 22 and a second portion which remains free of the electronic board 22. The second portion of the connection device can house electronic components, for example.

In an example in which the assembling member includes a first portion, and particularly a second portion, with a hole, the board includes a toe 21 engaging the hole. Therefore, the device 10 and the board 22 are rigidly connected without having to use a connection member such as a screw. In particular, the toe 21 is located on a peripheral edge of the board 22.

The assembly can further include a second electronic board (not shown). The second electronic board is mounted opposite a second face of the body 24. The second face is opposite the first face. In the example shown in FIG. 1, the second electronic board is placed on top of the connection device 20 and covers the open part of the body 24 in a rectangle shape.

The first or second board are, for example, insulated metal substrate boards or IMS boards which allow cooling of the components thereof by means of the board.

The invention also relates to a method of electrically connecting an electronic board, such as the electronic board 22. The method includes the assembly of the connection device 10 according to the invention with the electronic board 22 by means of the assembling member 30. Then, the electrical conductor 23 is connected to the electronic board 22, via a solder or weld for example.

The method according to the invention can be associated with any one of the features described above in relation to the connection device 10 or the assembly according to the invention.

Figure 8:
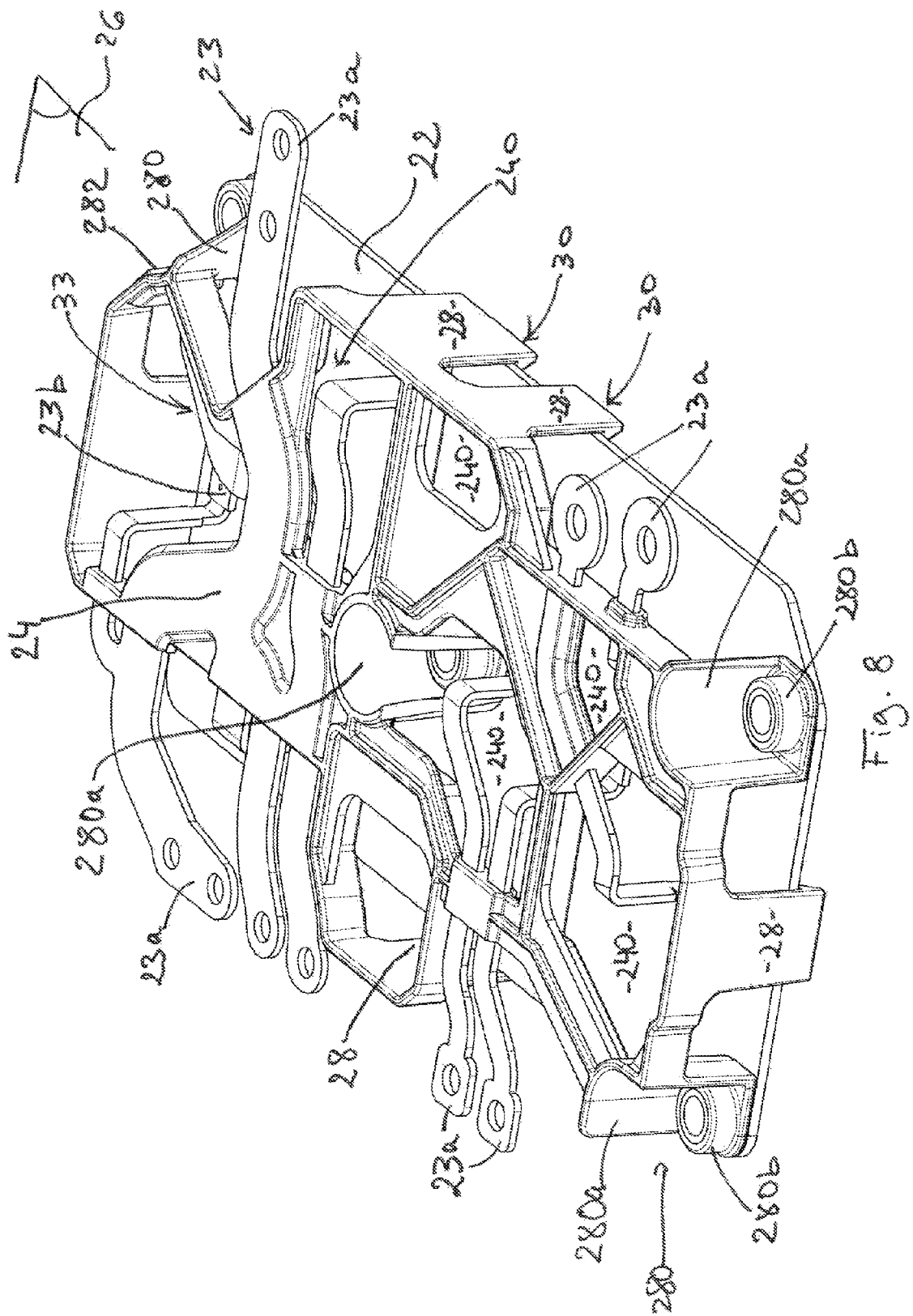
FIG. 8 shows a perspective view of a last example of the device according to the invention.
Figure 9:
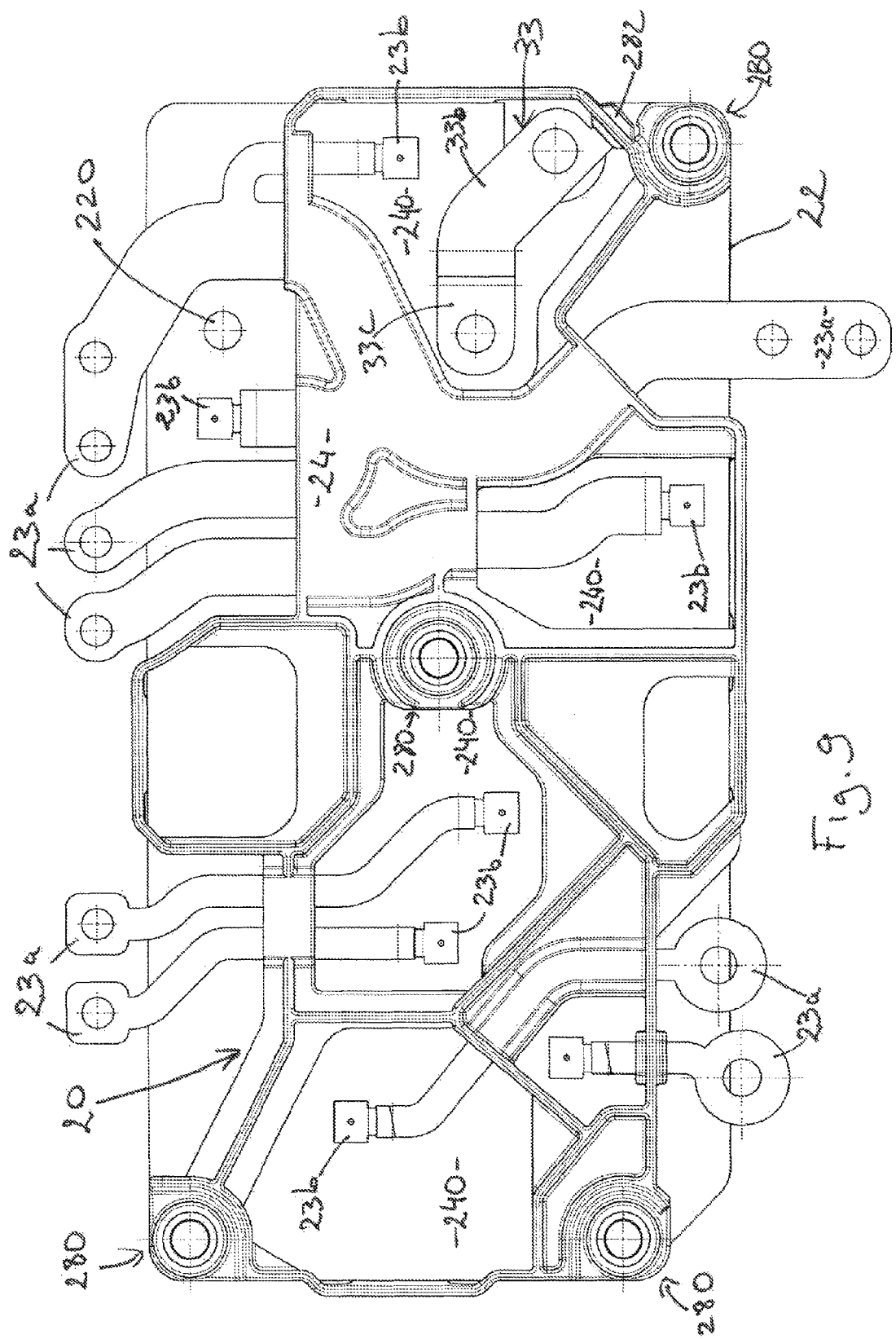
FIG. 9 shows a top view of the example of FIG. 8.

FIGS. 8 and 9 show another embodiment of the device 20 according to the invention which is associated with an electronic board 22. In this embodiment, the body 24 has a solid surface forming a wall which extends in the plane 26. Thanks to the wall shape thereof, the device 20 can hold the conductors 23 on a larger portion than in the example illustrated in FIG. 3. Therefore, the body 24 provides better holding of the conductors 23 in the path thereof as close as possible to the areas of the board 22 with which the second ends 23b thereof are intended to be brought into contact. The body 24 can include ribs in order to improve the rigidity thereof.

The wall 24 can include openings 240. When the device is positioned opposite the electronic board 22, these openings 240 allow access to the second ends 23b of the conductors 23 so as to provide an electrical contact between the conductors 23 and the board 22. The openings 240 can also allow access to components of the board 22.

In this embodiment, the device 20 includes at least one protuberance with an assembling member 30 as described above. In the specific example illustrated in FIGS. 8 and 9, the device 20 includes several protuberances 28 and respective assembling members 30 which allow the body 24 to be held opposite the electronic board 22, in particular by being placed at the periphery of the board 22. The body 24 can have openings, the respective peripheries of which include the start of one or more protuberances 28 in order to improve the flexibility thereof during the mounting of the device 20 on the board 22, in the case of mounting by clipping, for example.

The device 20 can further include means configured to hold the assembly formed by the device 20 and the electronic board 22 on a surface. Therefore, when the conductors 23 of the device 20 are electrically connected to the board 22, the assembly can be positioned on a surface. In particular, the means of the device 20 allow the electronic board 22 to be applied to the surface, for example a heat dissipation surface. These application means further allow better holding of the device 20 on the board 22 during the lifetime of the assembly. The application means can include a shaft-shaped protuberance 280 extending from the body 24. In particular, the application means includes a shaft wall portion 280a and a bottom 280b including an opening for receiving a means of fixing with the board 22 and the surface. The board 22 can include means for the sole application thereof to the surface, for example a hole 220 which receives a screw inserted into the application surface.

Figure 3:
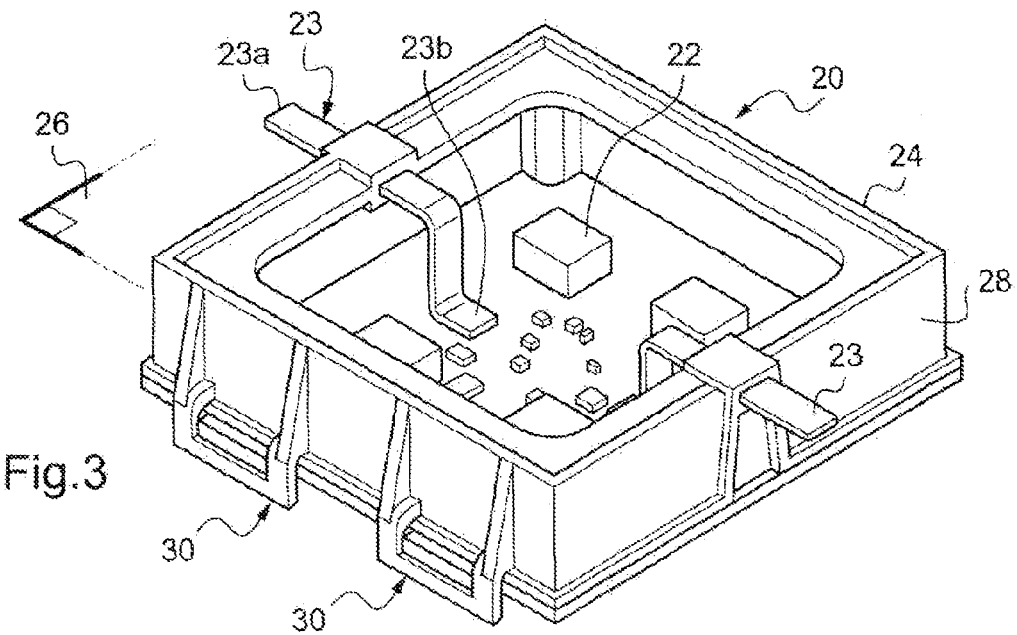
FIG. 3 shows a perspective view of an electrical connection device example according to the invention, which is connected to an electronic board.

In the example illustrated in FIGS. 3 and 4, the electrical conductors 23 are held by the body 24 at the plane 26. However, the device 20 according to the invention can include at least one conductor 33 held by a protuberance 282 extending in a transversal direction from the body 24. In particular, the conductor 33 can include a first portion extending into the protuberance 282 in a direction transverse to the plane 26.

In the example illustrated in FIGS. 8 and 9, the conductor 33 allows a ground connection between the electronic board 22 and the surface on which the assembly is applied. In particular, the conductor 33 includes a second portion 33b intended to be fixed on a shaft coming from the application surface and a third portion intended to be brought into contact with the electronic board 22, in particular with a conducting track of the board 22.

The invention claimed is:

1. A device for electrically connecting an electronic board comprising:
   at least one electrical conductor for conducting a current to and/or from said electronic board;
   a body extending at least in one plane and holding, in the plane, said electrical conductor at a portion of said conductor; and
   at least one protuberance extending from said body, said protuberance comprising at least one assembling member for assembling the connection device with said electronic board such that the body is placed opposite the electronic board,
   wherein the body has a wall shape which extends in the plane, and
   wherein the body includes at least one opening configured to allow access to the end of the conductors which is in contact with the board when the device is positioned on the board.

2. The device as claimed in claim 1, wherein the assembling member includes a first substantially flat portion starting at a distal end of the protuberance and extending towards the exterior of the connection device.

3. The device as claimed in claim 2, wherein said first portion includes a through-hole.

4. The device as claimed in claim 2, wherein the assembling member includes a second substantially flat portion transverse to the first portion, the second portion including a hole.

5. The device as claimed in claim 4, wherein the hole is a through-hole.

6. The device as claimed in claim 1, wherein said protuberance extends from said body in a direction transverse to said plane.

7. The device as claimed in claim 6, wherein the body has a substantially rectangular shape in said plane.

8. The device as claimed in claim 1, wherein the protuberance extends from a periphery of the body.

9. The device as claimed in claim 1, wherein the body and the protuberance are in one piece.

10. An assembly comprising:
    a first electronic board; and
    an electrical connection device as claimed in claim 1,
    wherein the body of the connection device has a first face which is placed opposite the first electronic board,
    wherein the assembling member rigidly connects together the first electronic board and the connection device,
    wherein the body has a wall shape which extends in the plane, and wherein the body includes at least one opening configured to allow access to the end of the conductors which is in contact with the board when the device is positioned on the board.

11. The assembly as claimed in claim 10, wherein the assembling member rigidly connects the connection device and the first board at a periphery of the first board.

12. The assembly as claimed in claim 10, wherein the connection device comprises a first substantially flat portion and the assembling member comprises a second substantially flat portion, both the first and second substantially flat portions comprising a hole, wherein the first electronic board includes a toe engaging the hole of the assembling member.

13. The assembly as claimed in claim 12, wherein said toe is located on a peripheral edge of the first electronic board.

14. The assembly as claimed in claim 10, further comprising a second electronic board mounted opposite a second face of the body, said second face being opposite the first face.

15. The assembly as claimed in claim 10, being further configured to be applied to a surface assembly, wherein the device includes a conductor configured to allow a ground connection between the electronic board and said surface.

16. A method of electrically connecting an electronic board comprising:
  assembling a device according to claim 1 with the electronic board using the assembling member; and
  connecting the electrical conductor of said connection device to the electronic board.

17. The method as claimed in claim 16, wherein the electrical conductor is connected by soldering.

* * * * *